United States Patent
Postel et al.

(10) Patent No.: US 11,323,808 B2
(45) Date of Patent: May 3, 2022

(54) METHOD AND SYSTEM FOR OPTIMIZING THE LOW-FREQUENCY SOUND RENDITION OF AN AUDIO SIGNAL

(71) Applicant: ARKAMYS, Levallois-Perret (FR)

(72) Inventors: François Postel, Paris (FR); Jacquemin Vidal, Leuville-sur-orge (FR)

(73) Assignee: ARKAMYS

(*) Notice: Subject to any disclaimer, the term of this patent is extended or adjusted under 35 U.S.C. 154(b) by 89 days.

(21) Appl. No.: 16/987,605

(22) Filed: Aug. 7, 2020

(65) Prior Publication Data

US 2021/0076132 A1 Mar. 11, 2021

Related U.S. Application Data

(63) Continuation of application No. 16/311,041, filed as application No. PCT/FR2017/051599 on Jun. 19, 2017, now abandoned.

(30) Foreign Application Priority Data

Jun. 20, 2016 (FR) ...................................... 1655698

(51) Int. Cl.
*H04R 3/04* (2006.01)
*H03G 9/02* (2006.01)
*H03G 5/02* (2006.01)
*H03G 3/02* (2006.01)

(52) U.S. Cl.
CPC ................. *H04R 3/04* (2013.01); *H03G 3/02* (2013.01); *H03G 5/025* (2013.01); *H03G 9/025* (2013.01); *H04R 2430/00* (2013.01); *H04R 2430/01* (2013.01); *H04R 2499/13* (2013.01)

(58) Field of Classification Search
CPC . H04R 3/02; H04R 11/08; H04R 1/30; H04R 2430/00; H04R 2430/01; H04R 2499/13; H04R 3/04; H04R 9/047; G10K 11/17817; G10K 11/17835; G10K 11/17854; G10K 11/17855; G10K 11/17879; G10K 15/02; G10K 2210/3028; G10K 2210/3039; G10K 2210/3046; G10K 2210/503; H03G 3/02; H03G 3/22; H03G 5/025; H03G 9/025; H04M 11/06
USPC ..................................... 381/104–109; 700/94
See application file for complete search history.

(56) References Cited

U.S. PATENT DOCUMENTS

| | | | | |
|---|---|---|---|---|
| 5,742,688 A | * | 4/1998 | Ogawa .................... | G10K 15/02 381/17 |
| 6,370,255 B1 | * | 4/2002 | Schaub ................ | H04R 25/505 381/104 |
| 2001/0009584 A1 | * | 7/2001 | Suruga .................... | H04H 60/04 381/119 |
| 2012/0308036 A1 | * | 12/2012 | Christoph .............. | H03G 9/005 381/86 |

(Continued)

*Primary Examiner* — Lun-See Lao
(74) *Attorney, Agent, or Firm* — Perman & Green, LLP

(57) ABSTRACT

A system and method for optimizing the low-frequency sound rendition of an audio signal, implementing variations in a plurality of parameters of the audio signal according to the volume level of the signal chosen by a user, in particular filtering or compression parameters, or parameters relating to the harmonics of the audio signal, while seeking to optimize the dynamics and the bandwidth of the audio signal according to the volume, in order to provide an optimal rendition to the user.

3 Claims, 1 Drawing Sheet

(56) References Cited

U.S. PATENT DOCUMENTS

2013/0054251 A1\* 2/2013 Eppolito ............ G10L 21/0316
704/500
2015/0222990 A1\* 8/2015 Hansen .................... H04R 3/04
381/103

\* cited by examiner

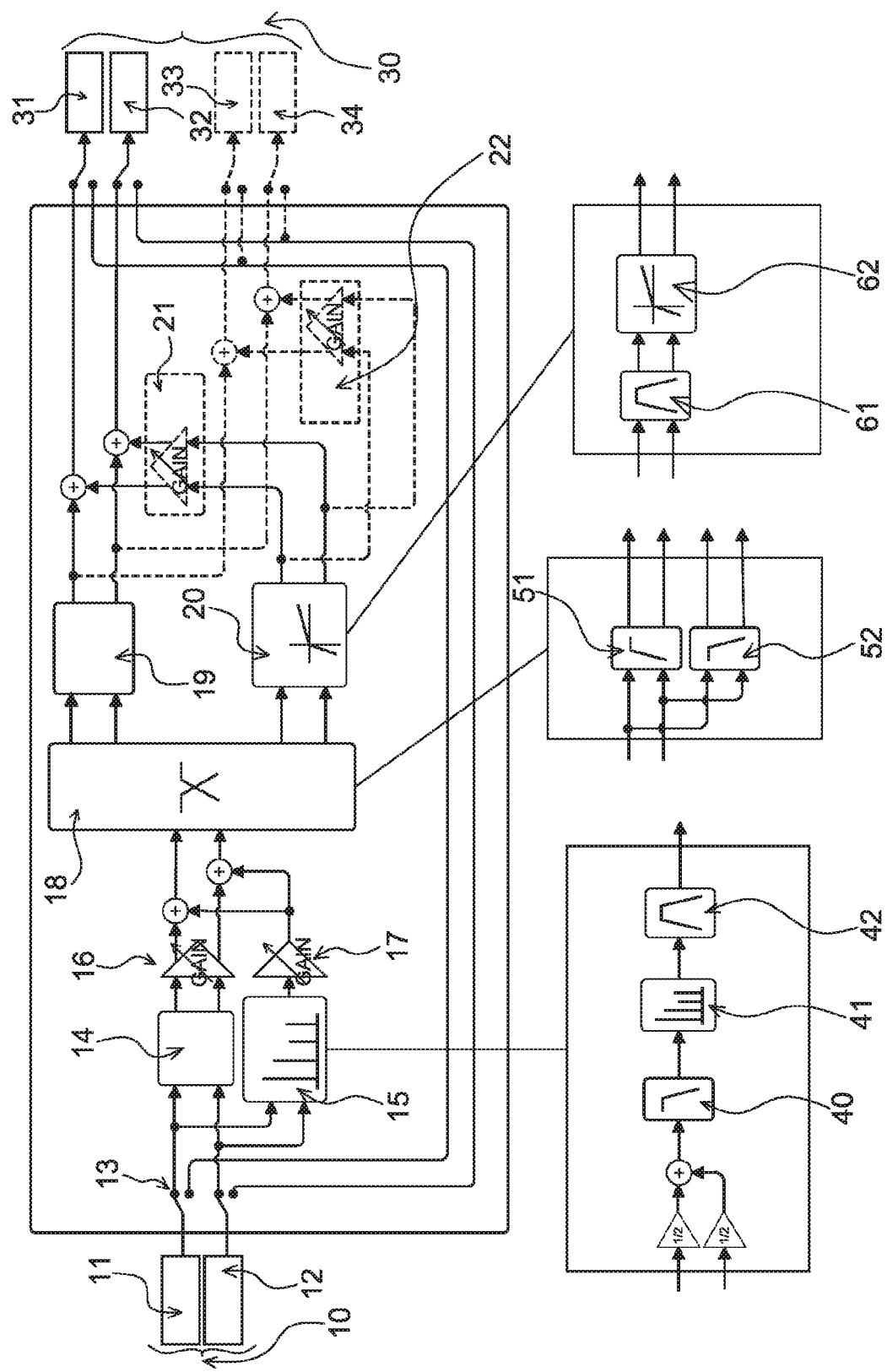

METHOD AND SYSTEM FOR OPTIMIZING THE LOW-FREQUENCY SOUND RENDITION OF AN AUDIO SIGNAL

CROSS REFERENCE TO RELATED APPLICATIONS

This application is a continuation of U.S. patent application Ser. No. 16/311,041 filed on 18 Dec. 2018, which is the National Stage of International Application No. PCT/FR2017/051599, having an International Filing date of 19 Jun. 2017, which designated the United States of America, and which International Application was published under PCT Article 21(2) as WO Publication No. 2017/220906 A1, and which claims priority from, and the benefit of French Application No. 1655698, filed on 20 Jun. 2016, the disclosures of which are incorporated herein by reference in their entireties.

BACKGROUND

1. Field

The present disclosure relates to the field of processing sound signals.

The present disclosure more particularly relates to a method and a system for optimising the low-frequency sound rendition of an audio signal.

2. Brief Description of Related Developments

Methods and systems are known in the prior art for improving the sound rendition in the low frequency range.

The "low frequency range" is understood in the present disclosure to be frequencies of less than 150 Hz.

A method known in the prior art in the international patent application published under number WO 2013/068359 (ARKAMYS) relates to a method for reducing parasitic vibrations of a loudspeaker environment and associated processing device. This invention of the prior art substantially concerns a method for reducing parasitic vibrations of a loudspeaker environment while maintaining the perception of the low frequencies of an electric sound signal, called the original sound signal, intended to be broadcast after processing by said loudspeaker having a cut-off frequency, comprising the following steps: —identifying a frequency band that causes the loudspeaker to vibrate, called the vibration frequency band, —isolating a low-frequency band of the original sound signal having a frequency close to the cut-off frequency of the loudspeaker as the upper limit, —generating at least one harmonic signal from the isolated low frequency band of the original sound signal, —combining the original sound signal and the harmonic signal to obtain a recombined signal, —removing the vibration frequency band from the recombined signal to obtain a signal that can be broadcast by the loudspeaker.

Methods are also known in the prior art for varying the gain in a static manner, in order to adjust the audio signal in the low frequency range.

SUMMARY

The purpose of the present disclosure is to overcome the drawbacks of the prior art by proposing a method and a system for optimising the low-frequency sound rendition of an audio signal, by varying numerous parameters according to the audio volume.

For this purpose, the present disclosure relates, in the broadest sense thereof, to a method for optimising the low-frequency sound rendition of an audio signal, implementing variations in a plurality of parameters of said audio signal according to the volume level of said audio signal chosen by a user, in particular filtering or compression parameters, or parameters relating to the harmonics of said audio signal, while seeking to optimise the dynamic range and the bandwidth of said audio signal according to the volume, in order to provide an optimal rendition to the user.

As opposed to the methods and systems known in the prior art, the method according to the present disclosure varies numerous parameters of the audio signal in order to provide an optimal rendition to the user.

Within the scope of the method according to the present disclosure, the aim is to optimise the dynamic range and the bandwidth of said audio signal according to the volume, in order to provide an optimal rendition to the user, at both a low and high volume, without being detrimental to the power handling of the system for reproducing said audio signal.

This plurality of parameters is adjusted, then stored by a person skilled in the art, then retrieved by the reproduction system as a function of the volume level chosen by the user.

Thus, the dynamic range is increased at a low volume level, while protecting the reproduction system at a high volume level. This thus improves the dynamic range of the low-frequency signal lost when listening at a low volume level as a result of the loudness effect of the human ear, while protecting the loudspeakers at a high volume level. This last point is an improvement on the aforementioned patent WO 2013/06835 (ARKAMYS), in that the parasites can be reduced at a high volume level, while optimising the performance of the loudspeakers at a low volume level.

According to one embodiment, said parameters are included in the group consisting of: the compression rate, the release time, the attack time, the recovery time, the threshold and the gain compensation.

Preferably, said method comprises a step of adjusting the characteristics of a high-pass filter according to the input level of said audio signal.

The present disclosure further relates to a system for optimising the low-frequency sound rendition of an audio signal, comprising means for varying a plurality of parameters of said audio signal according to the volume level of said audio signal chosen by a user, in particular filtering or compression parameters, or parameters relating to the harmonics of said audio signal, while seeking to optimise the dynamic range and the bandwidth of said audio signal according to the volume, in order to provide an optimal rendition to the user.

Advantageously, said parameters are included in the group consisting of: the compression rate, the release time, the attack time, the recovery time, the threshold and the gain compensation.

Preferably, said system comprises means for adjusting the characteristics of said high-pass filter according to the input level of said audio signal.

BRIEF DESCRIPTION OF THE DRAWINGS

The present disclosure will be better understood after reading the description, provided for illustration purposes only, of one embodiment of the present disclosure, with reference to the FIGURES, in which:

FIG. 1 shows the system according to the present disclosure, in one embodiment thereof.

DETAILED DESCRIPTION

The present disclosure relates to a method for optimising the low-frequency sound rendition of an audio signal, implementing variations in a plurality of parameters P1, P2, P3, ..., PN of said audio signal according to the volume level V1, V2, ..., VP of said audio signal chosen by a user, in particular filtering or compression parameters, or parameters relating to the harmonics of said audio signal, while seeking to optimise the dynamic range and the bandwidth of said audio signal according to the volume, in order to provide an optimal rendition to the user.

As opposed to the methods and systems known in the prior art, the method according to the present disclosure varies numerous parameters of the audio signal in order to provide an optimal rendition to the user.

Within the scope of the method according to the present disclosure, the aim is to optimise the dynamic range and the bandwidth of said audio signal according to the volume, in order to provide an optimal rendition to the user, at both a low and high volume, without being detrimental to the power handling of the system for reproducing said audio signal.

This plurality of parameters is adjusted, then stored by a person skilled in the art, then retrieved by the reproduction system as a function of the volume level chosen by the user.

Thus, the dynamic range is increased at a low volume level, while protecting the reproduction system at a high volume level.

For example, for a volume variation ranging from 0 (minimum volume=−100 dB of attenuation) to 30 (maximum volume=0 dB of attenuation), seven steps are considered here for adjusting the parameters of the elements in FIG. 1. The intermediate parameters are interpolated here.

With reference to FIG. 1, the following table is obtained:

TABLE 1

| Parameters | Volume level | | | | | | |
|---|---|---|---|---|---|---|---|
| | 0 | 5 | 10 | 15 | 20 | 25 | 30 |
| 14 | 14 × 0 | 14 × 5 | 14 × 10 | 14 × 15 | 14 × 20 | 14 × 25 | 14 × 30 |
| 40 | 40 × 0 | 40 × 5 | 40 × 10 | 40 × 15 | 40 × 20 | 40 × 25 | 40 × 30 |
| 41 | 41 × 0 | 41 × 5 | 41 × 10 | 41 × 15 | 41 × 20 | 41 × 25 | 41 × 30 |
| 42 | 42 × 0 | 42 × 5 | 42 × 10 | 42 × 15 | 42 × 20 | 42 × 25 | 42 × 30 |
| 16 | 16 × 0 | 16 × 5 | 16 × 10 | 16 × 15 | 16 × 20 | 16 × 25 | 16 × 30 |
| 17 | 17 × 0 | 17 × 5 | 17 × 10 | 17 × 15 | 17 × 20 | 17 × 25 | 17 × 30 |
| 51 | 51 × 0 | 51 × 5 | 51 × 10 | 51 × 15 | 51 × 20 | 51 × 25 | 51 × 30 |
| 52 | 52 × 0 | 52 × 5 | 52 × 10 | 52 × 15 | 52 × 20 | 52 × 25 | 52 × 30 |
| 19 | 19 × 0 | 19 × 5 | 19 × 10 | 19 × 15 | 19 × 20 | 19 × 25 | 19 × 30 |
| 61 | 61 × 0 | 61 × 5 | 61 × 10 | 61 × 15 | 61 × 20 | 61 × 25 | 61 × 30 |
| 62 | 62 × 0 | 62 × 5 | 62 × 10 | 62 × 15 | 62 × 20 | 62 × 25 | 62 × 30 |
| 21 | 21 × 0 | 21 × 5 | 21 × 10 | 21 × 15 | 21 × 20 | 21 × 25 | 21 × 30 |
| 22 | 22 × 0 | 22 × 5 | 22 × 10 | 22 × 15 | 22 × 20 | 22 × 25 | 22 × 30 |

It should be noted that the parameters mentioned in the left-hand column of Table 1 above correspond to the blocks shown in FIG. 1.

If thirty adjustment steps are considered, a plurality of parameters (14×0, 14×1, 14×2, 14×3, etc.) thus corresponds to each volume level.

In one embodiment, said parameters P1, P2, P3, ..., PN are included in the group consisting of: the compression rate, the release time, the attack time, the recovery time, the threshold and the gain compensation.

In one embodiment, said method comprises a step of adjusting the characteristics of said high-pass filter F according to the input level of said audio signal.

The present disclosure further relates to a system for optimising the low-frequency sound rendition of an audio signal, comprising means for varying a plurality of parameters P1, P2, P3, ..., PN of said audio signal according to the volume level V1, V2, ..., VP of said audio signal chosen by a user, in particular filtering or compression parameters, or parameters relating to the harmonics of said audio signal, while seeking to optimise the dynamic range and the bandwidth of said audio signal according to the volume, in order to provide an optimal rendition to the user.

In one embodiment, said parameters P1, P2, P3, ..., PN are included in the group consisting of: the compression rate, the release time, the attack time, the recovery time, the threshold and the gain compensation.

In one embodiment, said system comprises means for adjusting the characteristics of said high-pass filter F according to the input level of said audio signal.

FIG. 1 shows the system according to the present disclosure, in one embodiment thereof.

FIG. 1 shows that the system according to the present disclosure comprises an input signal 10 and an output signal 30.

The input signal 10 is composed of a left channel 11 and a right channel 12.

The output signal 30 is composed of a front left channel 31, a front right channel 32, a back left channel 33 and a back right channel 34.

The system according to the present disclosure comprises a so-called "by-pass" element 13, a delay module 14 and a harmoniser 15.

The system according to the present disclosure comprises two gain modules: a so-called "dry gain" module 16 and a so-called "wet gain" module 17.

The system according to the present disclosure further comprises a so-called "crossover" module 18, a second delay module 19 and a compression block 20.

Finally, said system according to the present disclosure comprises two further gain modules, a front low-frequency gain module 21, and a rear low-frequency module 22, situated before the output.

The harmoniser 15 is composed of:
- a pre-harmonic filter 40 of the type IIR (Infinite Impulse Response) constituted in one example embodiment of two identical biquad low-pass filters;
- a harmonic generator 41 (if the input signal into this module is negative, the output signal of this module is zero); and
- a post-harmonic filter 42 of the type IIR (Infinite Impulse Response) constituted in one example embodiment of one biquad high-pass filter and of two identical biquad low-pass filters.

The so-called "crossover" module 18 is composed of:
- a so-called "crossover high" sub-module 51: a filter of the type IIR (Infinite Impulse Response) constituted in one example embodiment of two identical biquad high-pass filters; and
- a so-called "crossover low" sub-module 52: 51: a filter of the type IIR (Infinite Impulse Response) constituted in one example embodiment of two identical biquad low-pass filters.

Said compression block 20 is composed of:
- a so-called "speaker cut" sub-module 61 constituted of a biquad filter; and
- another sub-module 62, which is a stereo compressor, comprising adjustable parameters such as the threshold, the compression slope, the expansion slope, the attack time, the release time and the gain compensation.

The above description of the present disclosure is provided for the purposes of illustration only. It is understood that a person skilled in the art can produce different variations of the present disclosure without leaving the scope of the patent.

What is claimed is:

1. A system for optimising the low-frequency sound rendition of an audio signal, characterised in that it comprises means for varying a plurality of compression parameters of said audio signal according to the volume level of said audio signal chosen by a user, while seeking to optimise the dynamic range and the bandwidth of said audio signal according to the volume, in order to provide an optimal rendition to the user, comprising a plurality of gain modules, a harmoniser comprising a pre-harmonic filter, a harmonic generator, a post-harmonic filter, and further comprising a crossover module composed of two filters of the type IIR (Infinite Impulse Response) and a compression block comprising a speaker cut sub-module constituted of a biquad filter.

2. The system for optimising the low-frequency sound rendition of an audio signal according to claim 1, characterised in that said parameters are included in the group consisting of: the compression rate, the release time, the attack time, the recovery time, the threshold and the gain compensation.

3. The system for optimising the low-frequency sound rendition of an audio signal according to claim 1, characterised in that it comprises means for adjusting the characteristics of a high-pass filter according to the input level of said audio signal.

* * * * *